(12) United States Patent
Buisman et al.

(10) Patent No.: US 9,118,283 B2
(45) Date of Patent: Aug. 25, 2015

(54) AMPLIFIER CIRCUIT

(71) Applicant: NXP B.V., Eindhoven (NL)

(72) Inventors: Koen Buisman, The Hague (NL); Mark Pieter van der Heijden, Eindhoven (NL); Mustafa Acar, Eindhoven (NL); Leo de Vreede, Pgnacker (NL)

(73) Assignee: NXP, B.V., Eindhoven (NL)

( * ) Notice: Subject to any disclaimer, the term of this patent is extended or adjusted under 35 U.S.C. 154(b) by 48 days.

(21) Appl. No.: 14/027,109

(22) Filed: Sep. 13, 2013

(65) Prior Publication Data

US 2014/0077877 A1    Mar. 20, 2014

(30) Foreign Application Priority Data

Sep. 14, 2012  (EP) ..................... 12184587

(51) Int. Cl.
*H03F 3/217*   (2006.01)
(52) U.S. Cl.
CPC ............ *H03F 3/2171* (2013.01); *H03F 3/2176* (2013.01)
(58) Field of Classification Search
CPC ........ H03F 3/38; H03F 3/2171; H03F 3/2176
USPC .............................................. 330/207 A, 251
See application file for complete search history.

(56) References Cited

U.S. PATENT DOCUMENTS

| | | | |
|---|---|---|---|
| 6,498,533 B1 * | 12/2002 | Sowlati | ........................... 330/98 |
| 6,525,611 B1 | 2/2003 | Dening et al. | |
| 2004/0026231 A1 | 2/2004 | Pribyl | |
| 2004/0214621 A1 * | 10/2004 | Ponce De Leon et al. | . 455/575.8 |
| 2009/0179704 A1 * | 7/2009 | Staudinger et al. | ........... 330/295 |
| 2011/0273236 A1 | 11/2011 | Heijden et al. | |

FOREIGN PATENT DOCUMENTS

JP    2005/204405 A    7/2005

OTHER PUBLICATIONS

Albulet, M. et al. "Effect of Switch Duty Ratio on the Performance of Class E Amplifiers and Frequency Multipliers", IEEE Transactions on Circuits and Systems-I: Fundamental Theory and Applications, vol. 45, No. 4, pp. 325-335 (Apr. 1998).
Eroglu, A. et al. "Phase Controlled Class E Amplifiers for Pulsing Applications", IEEE MTT-S International Microwave Symposium Digest, pp. 765-768 (Jun. 2009).
Calvillo-Cortes, D. A. et al. "A 65nm CMOS Pulse-Width-Controlled Driver with $8V_{pp}$ Output Voltage for Switch-Mode RF PAs up to 3.6Hz", IEEE International Solid-State Circuits Conference, 3 pgs (2011).
Acar, M. et la. "Analytical Design Equations for Class-E Power Amplifiers", IEEE Transactions on Circuits and Systems-I: Regular Papers, vol. 54, No. 12, pp. 2706-2717 (Dec. 2007).

(Continued)

*Primary Examiner* — Steven J Mottola

(57) ABSTRACT

An amplifier circuit comprising a driver (204, 304) configured to provide a switched mode input signal, a switching mode power amplifier (206, 306) configured to receive the switched mode input signal and provide an output signal for an external load (210, 310); and a sensor (208, 308) configured to sense the impedance of the external load (210, 310) The driver is configured to set the duty cycle of the switched mode input signal in accordance with the sensed impedance of the external load (210, 310).

13 Claims, 4 Drawing Sheets

(56) References Cited

OTHER PUBLICATIONS

Ozen, M. et al. "High-Efficiency RF Pulsewidth Modulation of Class-E Power Amplifiers", IEEE Transactions on Microwave Theory and Techniques, vol. 59, No. 11, pp. 2931-2942 (Nov. 2011).

Kee, S. D. et al. "The Class-E/F Family of ZVS Switching Amplifiers", IEEE Transactions on Microwave Theory and Techniques, vol. 51, No. 6, pp. 1677-1690 (Jun. 2003).

Van der Heijden, M. P. et al. A 19W High-Efficiency Wide-Band CMOS-GaN Class-N Chireix RF Outphasing Power Amplifier IEEE MTT-S International Microwave Symposium Digest, 4 pgs (Jun. 2011).

Sogl, B. et al. "A Multi-mode Power Amplifier for Enhanced PAE in Back-off Operation with Load Insensitive Architecture", IEEE Radio and Wireless Symposium, 4 pgs (2009).

Bezooijen van, A. et al. "A GSM/EDGE/WCDMA Adaptive Series-LC Matching Network Using RF-MEMS Switches", IEEE Journal of Solid-State Circuits, vol. 43, No. 10, pp. 2259-2268 (Oct. 2008).

Extended European Search Report for Patent Appln. No. 12184587.9 (Jun. 24, 2013).

* cited by examiner

AMPLIFIER CIRCUIT

CROSS-REFERENCE TO RELATED APPLICATIONS

This application claims the priority under 35 U.S.C. §119 of European patent application no. 12184587.9, filed on Sep. 14, 2012, the contents of which are incorporated by reference herein.

The present disclosure relates to the field of switching-mode power amplifiers and in particular, although not necessarily, radio-frequency switching-mode power-amplifiers.

According to a first aspect of the invention, there is provided an amplifier circuit comprising:

- a driver configured to provide a switched mode input signal;
- a switching mode power amplifier configured to receive the switched mode input signal and provide an output signal for an external load; and
- a sensor configured to sense the impedance of the external load,
- wherein the driver is configured to set the duty cycle of the switched mode input signal in accordance with the sensed impedance of the external load.

Setting the duty cycle in this way enables improvements in the energy efficiency of the amplifier when the impedance of the external load varies away from its ideal value.

The amplifier circuit may be a class-E switching mode power amplifier. Class-E switching mode power amplifiers can be less sensitive to changes in external load impedance than other types of switching mode power amplifiers.

The driver may be configured to set the duty cycle such that the switching voltage of the switching mode power amplifier is below a threshold level. The switching voltage may be the value of a drain voltage of a power transistor within the switching mode power amplifier at the moment that the transistor switches on. This can provide for zero voltage switching, or near-zero voltage switching, of the switching mode power amplifier. Zero voltage or near-zero voltage switching can reduce the losses in active components of the amplifier.

The driver may be configured to set the duty cycle according to a value retrieved from a database or look-up-table. The use of predetermined values, stored in a database or look-up-table, may reduce the computational power and hence the cost required to implement the invention.

The driver may be configured to set the duty cycle according to a value calculated by applying an approximating equation or model to the sensed impedance of the external load. The use of an approximating equation or model may provide good performance across a diverse range of external load values.

The amplifier circuit/sensor may further comprise an output voltage and current sensor configured to measure the voltage and current waveforms of the amplifier output, which are representative of the impedance of the external load.

The amplifier circuit may further comprise a switching voltage sensor configured to measure the voltage at the drain of a transistor within the switching mode power amplifier at the moment that the transistor switches on. This measured voltage may be referred to as the switching voltage. The switching voltage of the transistor drain will be a function of the applied loading and should be decreased or minimized to reduce switching losses in this transistor. Consequently, the driver may be configured to set the duty cycle based on the measured switching voltage such that it reduces the measured voltage at the drain of the transistor to a level that is below a threshold value. The driver may be configured to iteratively set the duty cycle to reduce the measured voltage at the drain of the transistor to a level that is below a threshold value. Therefore, such a measurement can ensure that the switching voltage is minimised or reduced irrespective of the conditions under which the amplifier is operating. This can yield higher efficiency of such an amplifier when operating with changing loading conditions.

The sensor may be configured to sense the complex value of the external load impedance.

The sensor may be configured to sense the incident or reflected power at the output of the amplifier circuit in order to determine the impedance of the external load. The sensor may be a directional coupler configured to sense the impedance of the external load.

The amplifier circuit may further comprise a bias voltage controller configured to set the bias voltage of the switching mode power amplifier in accordance with the sensed impedance of the external load. Changing the bias voltage in response to changes in the external load impedance can prevent too high voltage levels that can damage the active components of the amplifier or prevent the occurrence of excessive distortion in some mismatch conditions.

The driver may be a CMOS driver with a variable duty cycle capability.

The amplifier circuit may be configured to generate/provide radio frequency energy (for example for heating) in an efficient manner to an (external) non-constant RF load. This can allow for reduction in energy losses when the external load impedance changes as its temperature varies, or for applications in which the nature of the load may change from time to time as in a microwave oven.

The amplifier circuit may be configured to provide a radio frequency communication signal. This can allow for reduction in energy losses when the impedance experienced by the antenna changes, for example in response to changes in the environment when a communication device is moved from location to location or when the amplifier circuit is operated in an antenna system with multiple radiating elements (e.g. a phase array antenna).

A description is now given, by way of example only, with reference to the accompanying drawings, in which.

Embodiments of the present invention relate to a closed-loop amplifier circuit that monitors the impedance of the external load of an RF switching-mode power amplifier (SMPA), based on which the duty cycle of a pulsed driver signal at the input of SMPA is adjusted. By controlling the duty cycle in this way, the time intervals are changed for charging/discharging capacitors in the circuit and likewise the stored energy of any inductors inside an output matching network such that the efficiency of the SMPA can be improved. By applying this duty cycle control system, a change in the amplifier matching conditions can be achieved without introducing any internal change in the circuit, such as for example a change in the characteristics of an internal variable-impedance element.

Several implementations of SMPA's exist, such as class D, class E, and class F amplifiers. In view of both complexity and efficiency, the class-E amplifier is a particularly good choice for the SMPA in embodiments of the present invention. Several class-E topologies exist and all of them could be used in the proposed invention, however some topologies are more suitable. In particular, the so-called 'finite dc-feed inductance' class-E amplifiers, of which the parallel-circuit class-E topology is an example, have particularly appropriate properties. This class-E topology has a low sensitivity to a change in the external load impedance, while its practical range can be further improved by using switch duty cycle control.

There are many kinds of class-E power amplifiers, such as the classical class E, sub-harmonic class E, parallel-circuit class E, even-harmonic class E, and so on. They can be identified by the parameter q which can be expressed as:

$$q = \frac{1}{\omega\sqrt{L_{feed}C_{out}}} = \frac{\omega_R}{\omega}.$$

Here $\omega_R$ is the resonant frequency to which the parallel ($L_{feed}C_{out}$) network is tuned. Hence q is the ratio of the parallel tuned frequency to the frequency of operation ($\omega$) of the amplifier. The q values of the standard class-E, sub-harmonic class E, parallel-circuit class E and even-harmonic class-E amplifiers are 0, 0.5, 1.412, and 2 respectively. For the present invention a particularly suitable embodiment, having the least load sensitive behaviour, has a design parameter q in the range of 1.3 to 1.4.

Figure 1:
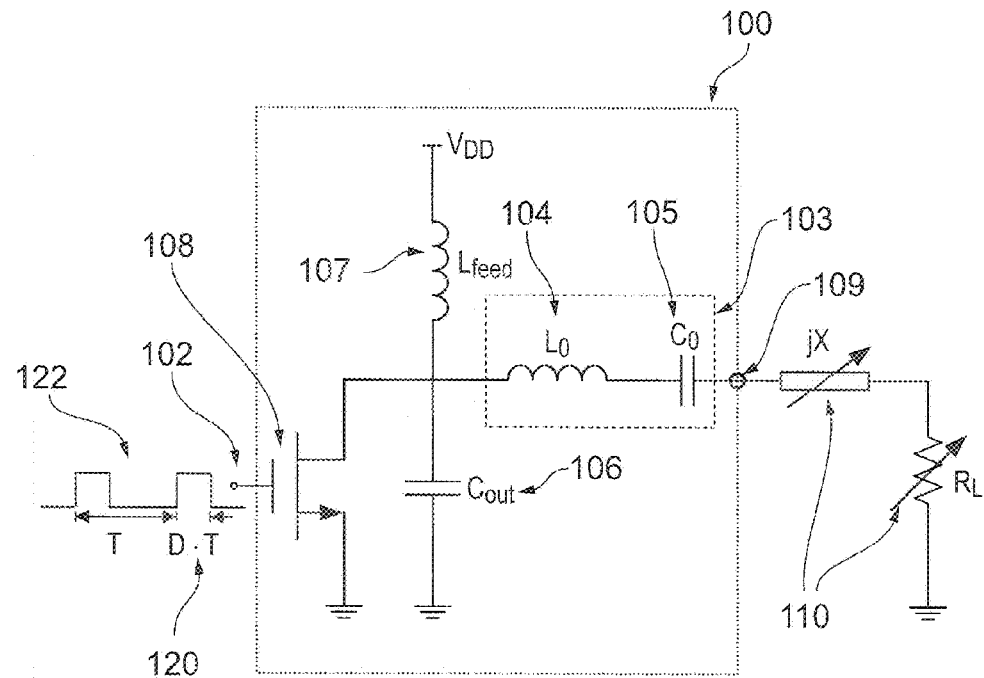
FIG. 1 illustrates a class-E power amplifier with a changeable external load impedance at its output and a variable duty cycle at its input that can be used with an embodiment of the invention.

FIG. 1 shows a class-E SMPA 100 that receives an input signal 122 at its input terminal 102. The input signal 122 is a square wave with a variable duty cycle. The SMPA 100 is connected to a changeable external load impedance $R_L+jX$ 110 at its output terminal 109. The external load impedance 110 consists of a real and imaginary part.

The input terminal 102 of the SMPA 100 is connected to the gate of a power transistor 108. A suitable type of power transistor would be a FET based transistor, such as a GaN HEMT or a MOSFET. The power transistor 108 may be referred to as the active device of the SMPA 100. The source of the power transistor 108 is connected to ground. The drain of the power transistor 108 is connected to the first terminal of a feed inductor $L_{feed}$ 107. The second terminal of the feed inductor $L_{feed}$ 107 is connected to supply voltage $V_{DD}$. The drain of the power transistor 108 is also connected to the first plate of an output capacitor $C_{out}$ 106. The second plate of the output capacitor $C_{out}$ 106 is connected to ground.

The drain of the power transistor 108 is connected to the output terminal 109 by a filter 103. The filter 103 comprises a filter inductor $L_0$ 104 connected in series with a filter capacitor $C_0$ 105. The filter 103 allows only the fundamental frequency to be provided at the output terminal 109.

The highest theoretical efficiency of such a SMPA (that is 100%) is achieved by operating its active device 108 as a switch. Such theoretical operation requires a switch with zero "on resistance" and infinite "off resistance". It also requires a class-E output matching network, specifically a network designed to satisfy the class-E switching condition that, at the time of switching, the drain voltage of the transistor switch is zero ('zero voltage switching'). In this way it is possible to reduce the overlap between the switch voltage and current waveforms and thereby minimise or reduce switching energy losses. If, for a given fixed duty cycle, the external load impedance 110 of a class-E amplifier is varied away from its design expectation value, the class-E condition is violated and switching losses will increase. Changing the duty cycle can dynamically modify the performance of a class-E power amplifier. A principle of embodiments of the invention is to preserve the class-E condition for different external loads by varying the duty cycle 120 of the pulsed input signal 122.

Figure 2:
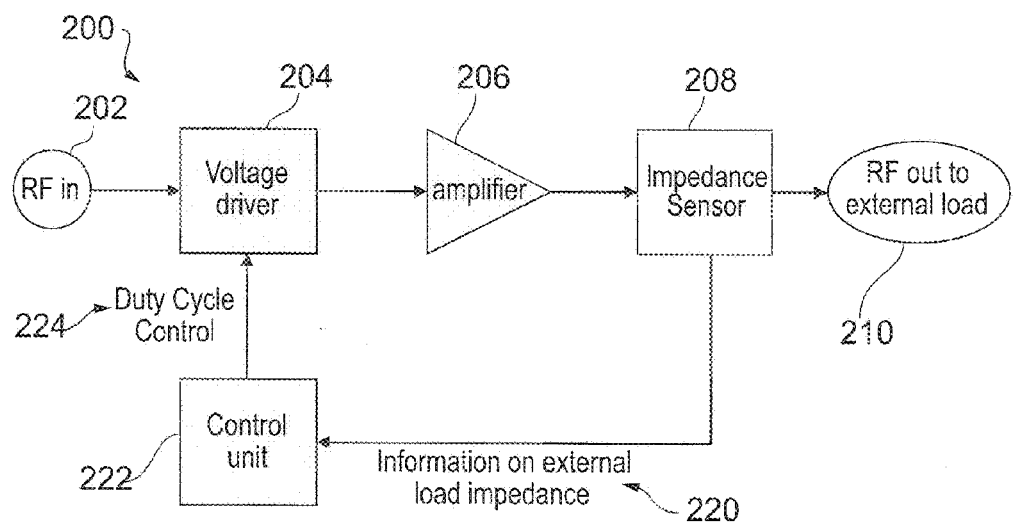
FIG. 2 illustrates schematically an amplifier circuit according to an embodiment of the invention.

FIG. 2 illustrates a schematic diagram of a closed-loop amplifier circuit 200 according to an embodiment of the invention. A radio frequency input signal 202 is supplied to the input of a voltage driver 204. The voltage driver 204 provides an output signal with a given duty cycle to the input of a class-E amplifier 206. The amplifier 206 provides an RF output signal to an external load 210, via an impedance sensor 208. This impedance sensor 208 may be a directional coupler, or a sensor configured to sense the incident/reflected power at the output of the SMPA, or any other means known to persons skilled in the art by which the complex value of the external load impedance may be determined. The impedance sensor 208 sends an impedance signal 220 to a control unit 222. The impedance signal 220 is representative of the determined impedance value of the external load or can be used by the control unit 222 to determine the impedance value of the external load.

The control unit 222 then provides a control signal 224 to the voltage driver 204 to set the duty cycle of the signal provided to the input of the class-E amplifier 206. Any change in the external load impedance can thereby be accommodated to by appropriate modification of the duty cycle. Such modifications allow minimisation or reduction of power losses within the amplifier 206 by restoring the class-E zero voltage switching condition. The required change to the duty cycle could be determined iteratively by changing the duty cycle until the switching voltage, as measured by an appropriate sensor, has been reduced to zero or an acceptably low level. An acceptably low level could be one that is less than a threshold. Alternatively, the appropriate duty cycle could be selected from a database or look-up-table comprising the most suitable values of duty cycle for a range of different possible external load impedances for the particular embodiment of the invention concerned. Another option is to calculate the appropriate duty cycle by applying an approximating equation or model to the sensed impedance of the external load. Such a calculated value could provide an appropriate duty cycle for a diverse range of impedance loading values.

In some embodiments, the amplifier 206, the impedance sensor 208 and the control unit 222 can all be provided by a single integrated circuit (IC).

Figure 3:
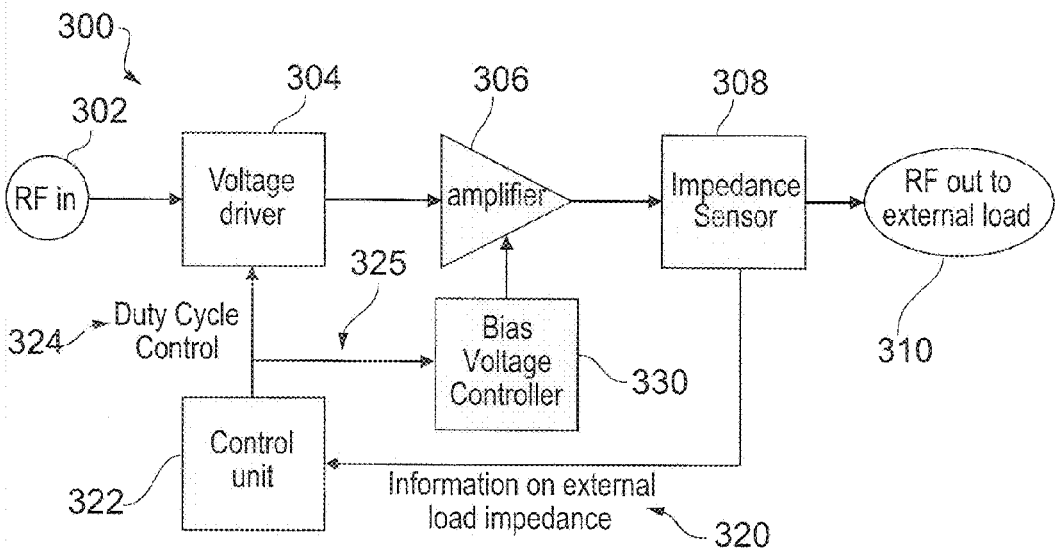
FIG. 3 illustrates schematically an amplifier circuit according to an embodiment of the invention.

FIG. 3 illustrates a schematic diagram of a closed-loop amplifier circuit 300 according to an embodiment of the invention similar to that of FIG. 2. Features common to both FIGS. 2 and 3 will not be discussed further in order to avoid obscuring the differentiating features of FIG. 3.

The control unit 322 of FIG. 3 provides a voltage control signal 325 to a bias voltage controller 330 in addition to providing a duty cycle control signal 324 to the voltage driver 304. The bias voltage controller 330 sets the bias voltage of the class-E amplifier 306 in accordance with the voltage control signal 325. This bias voltage is depicted as $V_{DD}$ in FIG. 1. In some situations, it may not be possible to avoid reduced efficiency of the active devices in the amplifier solely through adjusting the duty cycle of the input signal. This may arise when the external load impedance is very different to the value appropriate to the design specification of the amplifier without duty cycle control. Changing the bias voltage in this way can help to keep the aimed output power at a desired level or reduce the likelihood of efficiency reduction or failure of the active devices in the amplifier and therefore maintain high performance of the amplifier within the safe operating conditions of the active devices. It will be appreciated that the methods used to determine the appropriate value of the duty cycle may also be applied to determine the appropriate value for the bias voltage, including the use of databases or look-up-tables, approximating equations or models, or iterative methods.

Figure 4:
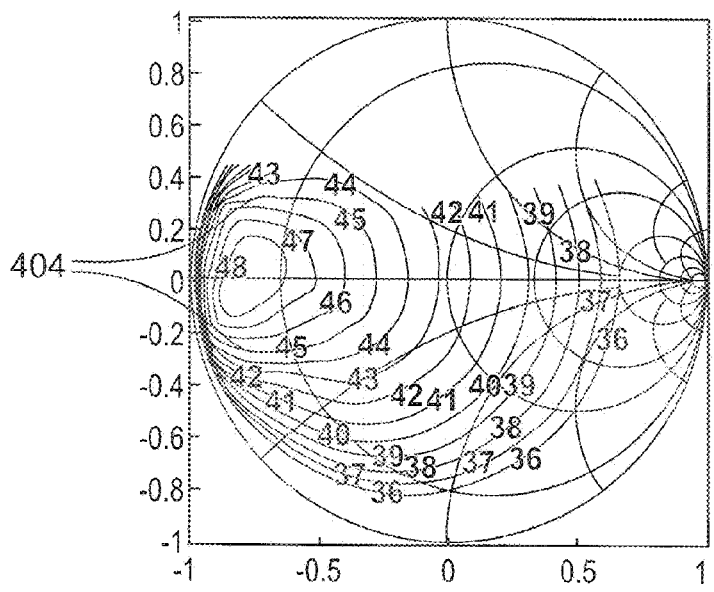
FIGS. 4 and 5 illustrate graphically experimental results of an amplifier circuit according to an embodiment of this invention.
Figure 5:
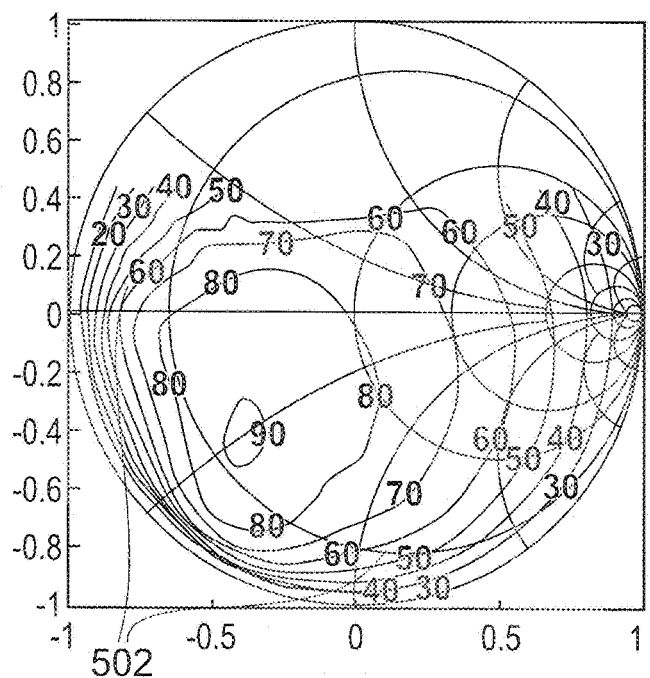

FIGS. 4 and 5 provide simulation results in the form of Smith charts that illustrate the performance of a 60 Watt RF embodiment of the present invention. FIG. 4 shows the output power achieved across a range of different external load impedances, by varying the duty cycle. FIG. 5 shows the corresponding efficiencies of the amplifier. These charts show plots of contour lines of constant values of the output power and efficiency respectively. It can be seen from FIG. 4 that the contour line 404 corresponding to an output power of 45 dBm surrounds a significant area of the chart. In FIG. 5 efficiencies of 60% and above are surrounded by the indicated contour line 502. It can be seen from FIG. 5 that these high efficiencies, greater than 60%, cover a very large area of the chart which corresponds to a large range of different external load impedances. FIG. 5 also shows that very high efficiencies, in excess of 90%, are achievable across a range of impedances.

Figure 6:
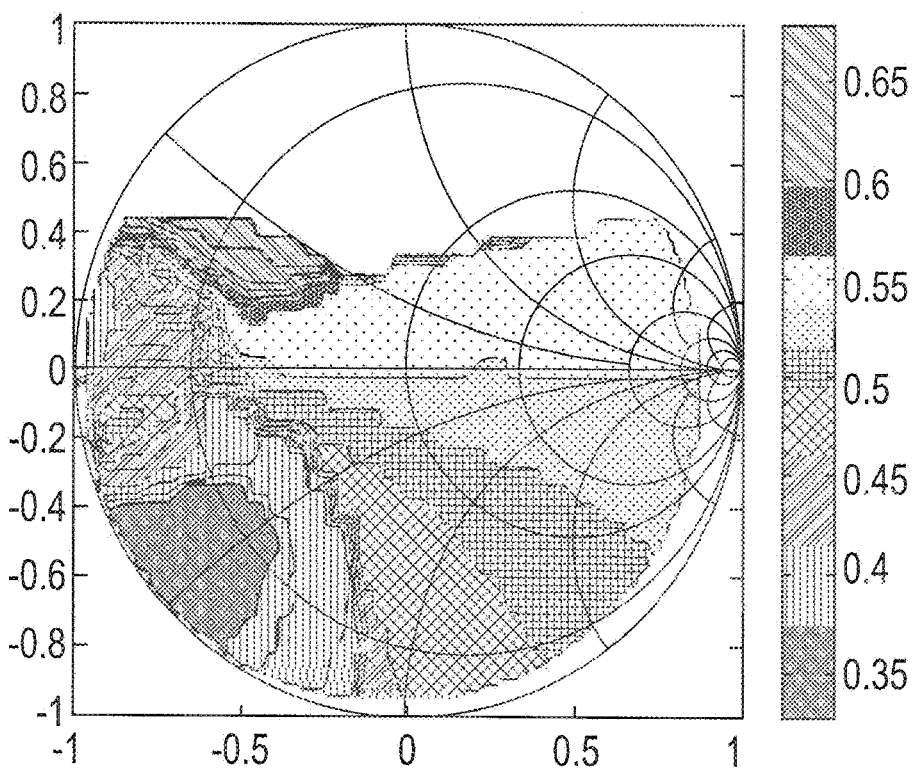
FIG. 6 illustrates graphically the duty cycle values required to achieve the efficiency illustrated by FIG. 5.

FIG. 6 shows, in Smith chart form, the duty cycles used to achieve the output powers and efficiencies shown in FIGS. 4 and 5. The value of the required duty cycle can be seen to range from below 0.35 to above 0.65.

Figure 7:
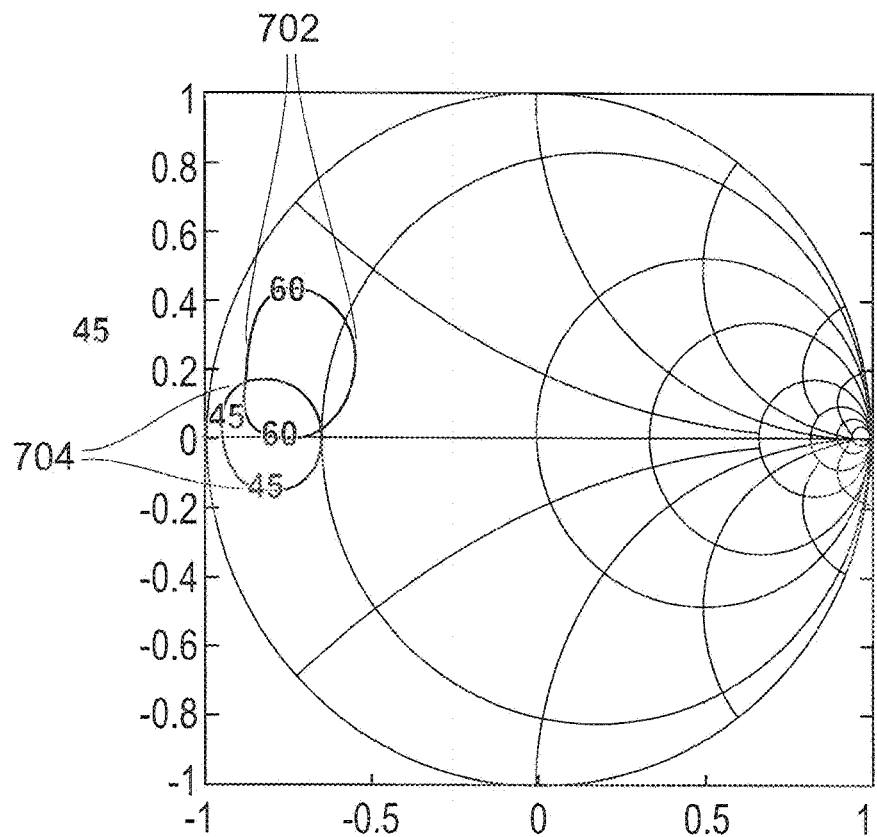
FIG. 7 illustrates graphically experimental results illustrating the output power and efficiency of a standard class-AB amplifier.

FIG. 7 provides simulation results, again in the form of a Smith chart, that illustrate the power output 704 and efficiency 702 of a standard class-AB amplifier. The region of efficiency greater than 60% is shown with a first contour 702 on the chart. The region with an output power greater than 45 dBm is shown with a second contour 704 on the chart. The small size of these regions represents a small range of output impedance values for which acceptable levels of efficiency and output power can be achieved. A comparison with the much larger corresponding regions of FIG. 4 (404) and FIG. 5 (502) respectively shows the substantial improvement that can be realised by controlling the duty cycle, as in the present invention.

Although the above embodiments are described with respect to a class-E power amplifier, it will be appreciated that other switching mode amplifiers, such as the class D or class F could be used to embody the present invention.

Embodiments disclosed herein can compensate for changing loading conditions at the output by changing only the input signal properties, without sacrificing unnecessary efficiency and output power. The proposed approach can maintain high efficiency and high power delivered to the load over a much wider impedance range than conventional power amplifiers. Also, no dissipating elements or tunable matching networks may need to be added to the circuitry for load correction/or limiting the load variation.

Embodiments of this invention may provide superior performance in a variety of different applications where the external load can have a changeable impedance. Such applications include radio frequency communication devices where the antenna of the device may experience different impedances as the environment around the device changes, such as when a portable communication device is moved to a different location. Another suitable type of application arises where radio frequency heating is required. In some cases, such as microwave ovens, the impedance of the load may change significantly depending on what the device is used to heat. In other cases, such as radio frequency plasma lighting, the impedance may vary significantly depending on the temperature of the external load. In all such applications, the energy efficiency of amplifiers can be improved by implementing embodiments of the present invention.

The invention claimed is:

1. An amplifier circuit comprising:
   a driver configured to provide a switched mode input signal;
   a switching mode power amplifier configured to receive the switched mode input signal and provide an output signal for an external load; and
   a sensor configured to sense the impedance of the external load;
   wherein the driver is configured to set the duty cycle of the switched mode input signal in accordance with the sensed impedance of the external load; and
   wherein the driver is configured to set the duty cycle such that a switching voltage of the switching mode power amplifier is below a threshold level.

2. An amplifier circuit as in claim 1, wherein the amplifier is a class-E switching mode power amplifier.

3. An amplifier as in claim 1, wherein the switching voltage is the value of a drain voltage of a power transistor within the switching mode power amplifier at the moment that the transistor switches on.

4. An amplifier circuit as in claim 1, wherein the driver is configured to set the duty cycle according to a value retrieved from a database or a look-up-table in accordance with the sensed impedance of the external load.

5. An amplifier circuit as in claim 1, wherein the driver is configured to set the duty cycle according to a value calculated by applying an approximating equation or model to the sensed impedance of the external load.

6. An amplifier circuit as in claim 1, further comprising a switching voltage sensor configured to measure the switching voltage, wherein the driver is configured to set the duty cycle based on the measured switching voltage such that it reduces the measured switching voltage to a level that is below a threshold value.

7. An amplifier circuit as in claim 1, wherein the sensor is configured to sense the complex value of the external load impedance.

8. An amplifier circuit as in claim 1, wherein the sensor is configured to sense the incident or reflected power at the output of the amplifier circuit in order to determine the impedance of the external load.

9. An amplifier circuit as in claim 1, wherein the sensor is a directional coupler configured to sense the impedance of the external load.

10. An amplifier circuit as in claim 1, further comprising a bias voltage controller configured to set the bias voltage of the switching mode power amplifier in accordance with the sensed impedance of the external load.

11. An amplifier circuit as in claim 1, wherein the driver is a CMOS driver with a variable duty cycle capability.

12. An amplifier circuit as in claim 1, configured to provide radio frequency heating.

13. An amplifier circuit as in claim 1, configured to provide a radio frequency communication signal.

* * * * *